United States Patent
Nagae

(10) Patent No.: US 6,189,207 B1
(45) Date of Patent: Feb. 20, 2001

(54) METHOD OF MOUNTING PARTS

(75) Inventor: Kazuo Nagae, Kofu (JP)

(73) Assignee: Matsushita Electric Industrial Co., Ltd., Osaka (JP)

( * ) Notice: Under 35 U.S.C. 154(b), the term of this patent shall be extended for 0 days.

(21) Appl. No.: 08/836,044

(22) PCT Filed: Sep. 12, 1996

(86) PCT No.: PCT/JP96/02602

§ 371 Date: Jul. 2, 1997

§ 102(e) Date: Jul. 2, 1997

(87) PCT Pub. No.: WO97/10694

PCT Pub. Date: Mar. 20, 1997

(30) Foreign Application Priority Data

Sep. 13, 1995 (JP) .................................................. 7-235077

(51) Int. Cl.[7] .................................................. H05K 3/30
(52) U.S. Cl. .................................. 29/836; 29/832; 29/740
(58) Field of Search ............................. 29/712, 740, 741, 29/742, 743, 832, 834, 836

(56) References Cited

U.S. PATENT DOCUMENTS

| | | | |
|---|---|---|---|
| 5,044,069 | * | 9/1991 | Asai et al. ........................ 29/741 X |
| 5,193,268 | * | 3/1993 | Ono et al. .............................. 29/739 |
| 5,400,497 | * | 3/1995 | Watanabe et al. .................. 29/743 X |
| 5,740,604 | * | 4/1998 | Kitamura et al. ....................... 29/832 |

FOREIGN PATENT DOCUMENTS

| | | | |
|---|---|---|---|
| 478-360 | * | 9/1990 | (EP) ...................................... 29/739 |
| 5-128122 | | 5/1993 | (JP) . |
| 5-226882 | | 9/1993 | (JP) . |
| 6-82899 | | 11/1994 | (JP) . |
| 7-162194 | | 6/1995 | (JP) . |

* cited by examiner

*Primary Examiner*—Lee Young
*Assistant Examiner*—Rick Kiltae Chang
(74) *Attorney, Agent, or Firm*—McDermott, Will & Emery

(57) ABSTRACT

In a parts mounting method having plural parts feed units, for setting aside a parts feed unit at a refill position if running short of a certain part in the process of mounting parts, and continuing parts mounting in other parts feed units, it is intended to reduce production stops due to parts shortage, and enhance the operation rate of the mounting machine. To achieve the object, the method of the invention comprises a step of judging if parts are refilled in the parts feed unit 4R at the refill position when parts shortage occurs while mounting parts in the parts feed unit 4L, a step of judging if all parts feed units 4L, 4R are out of the parts which are in shortage if parts are not refilled, and a step of mounting parts from the parts feed unit 4R at the refill position if shortage parts are present in the parts feed unit 4R at the refill position.

10 Claims, 4 Drawing Sheets

FIG. 3(a)(1) (PRIOR ART)

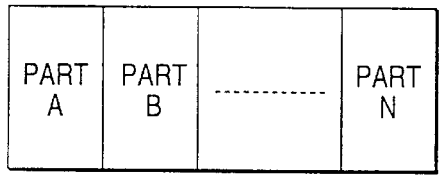

PARTS FEED UNIT L

FIG. 3(a)(2) (PRIOR ART)

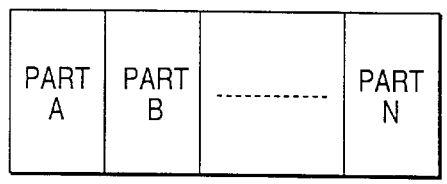

PARTS FEED UNIT R

PARTS FEED UNIT L REFILL POSITION     ACTIVE POSITION     PARTS FEED UNIT R REFILL POSITION

FIG. 3(b)(1) (PRIOR ART)

 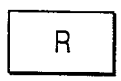

IF PARTS SHORTAGE OCCURS
IN PARTS FEED UNIT L
DURING PRODUCTION . . .

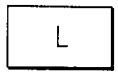 

PRODUCTION IS CONTINUED IN PARTS
FEED UNIT R, WHILE PARTS ARE FILLED
IN PARTS FEED UNIT L.

↓

WHEN PARTS SHORTAGE OCCURS FURTHER
IN PARTS FEED UNIT R . . .

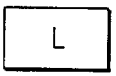 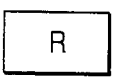

PRODUCTION IS CONTINUED IN PARTS
FEED UNIT L, WHILE PARTS ARE FILLED
IN PARTS FEED UNIT R.

METHOD OF MOUNTING PARTS

TECHNICAL FIELD

The present invention relates to a parts mounting method in a mounting machine of electronic parts or the like.

BACKGROUND ART

Recently, along with the advancement of electronics revolution, further enhancement of productivity is also required in electronic parts mounting machines. Conventional electronic parts mounting machines are described below while referring to FIG. 2, FIG. 3, and FIG. 4.

FIG. 2 shows a schematic constitution of an electronic parts mounting machine. Reference numeral 1 denotes a rotary head, which mounts parts by means of plural nozzles 2. Reference numeral 3 denotes an X-Y table, which fixes a board to mount parts on, and positions the board beneath the nozzles 2. Reference numerals 4L, 4R are parts feed units, and plural parts cassettes (parts feed means) 5 are mounted on each one thereof, and desired parts cassettes are positioned beneath the nozzles 2. Reference numeral 7 denotes a controller, which controls the entire electronic parts mounting machine. Reference numeral 10 is an indicator warning the shortage of parts to the operator, 11 is board carrying means, and 12 is board discharge means.

Referring now to FIGS. 3(a)(1), 3(a)(2) and 3(b)(1) to 3(b)(3), the operation of parts feed units 4L, 4R (hereinafter shown merely as L and R) is described. FIGS. 3(a)(1) and 3(a)(2) show the configuration of parts cassettes 5 in the parts feed units L, R. Both parts feed units L, R are in completely identical parts layout. This is intended to continue production by other parts feed unit R or L if parts are used up during production in one parts feed unit L or R. FIGS. 3(b)(1) and 3(b)(3) show the motion of the parts feed units L, R in the event of parts shortage during production. In the state shown in FIG. 3(b)(1), the parts feed unit L is in the process of production in the active position, while the parts feed unit R is located at the parts refill position not interfering the parts feed unit L. Herein, when parts shortage occurs, it is changed to the state shown in FIG. 2(b)(2). That is, the parts feed unit L moves to the parts refill position, and the parts feed unit R moves to the active position to continue production. The operator refills the parts feed unit L. When further parts shortage occurs, the state becomes as shown in shown in FIG. 3(b)(3). That is, the parts feed unit R moves to the parts refill position, and the parts feed unit L moves to the active position to continue production. By thus exchanging the parts feed units L and R, drop of operation rate due to parts shortage is prevented.

The conventional parts mounting method employing such plural parts feed units is specifically described below by referring to the flowchart in FIG. 4. Parts are sucked to the nozzles 2 from the parts feed unit L (step #101), and it is judged if there are parts or not (step #102), and if there are parts, parts are mounted on a board fixed on the X-Y table 3 (step #103). It is then checked if all parts to be mounted on the board by this mounting machine are completely mounted (hereinafter called EOP) or not (step #104), and the operation of steps #101 to #103 is repeated until reaching the EOP. When reaching the EOP, the mounted board is discharged, and next board is sent in (step #105).

On the other hand, if shortage of parts is detected at step #102, the parts feed unit L is moved to the refill position (step #106), and production is continued by the parts feed unit R (steps #107 to #111). Herein, steps #107 to #111 are same in processing as steps #101 to #105. In the midst of steps #107 to #111, if parts shortage occurs at step #108, the parts feed unit R is moved to the refill position (step #112), and it is judged if the parts feed unit L running short of parts in the first place is still in the process of parts refill or not (step #113), and if it is in the process of parts refill, production is stopped due to parts shortage (step #121), or if parts refill has been complete, going back to step #101, production is continued in the parts feed unit L.

In such mounting method, however, unless parts are refilled immediately by the operator, both the parts feed units L and R may be out of parts, and production may be stopped, so that the operation rate may decline. In particular, in the nighttime when the number of workers is small, it was difficult to operate continuously for a long time.

DISCLOSURE OF THE INVENTION

In the light of the problems of the prior art, it is hence a primary object of the invention to present a parts mounting method capable of decreasing productions stops due to parts shortage, operating continuously for a long time, and enhancing the operation rate of the mounting machine.

The parts mounting method of the invention is a parts mounting method for mounting parts by selectively using plural parts feed units, comprising a step of checking for shortage of same parts in plural parts feed units when parts shortage occurs, and a step of feeding parts from a parts feed unit not running short for mounting parts.

The invention also presents a parts mounting method, having plural parts feed units, for setting aside a parts feed unit at a refill position if running short of a certain part in the process of mounting parts, and continuing parts mounting in other parts feed units, comprising a step of judging if parts are refilled in the parts feed unit at the refill position when parts shortage occurs while mounting parts, a step of judging if all parts feed units are out of the parts which are in shortage if parts are not refilled, and a step of mounting parts from the parts feed unit at the refill position if shortage parts are present in the parts feed unit at the refill position.

BRIEF DESCRIPTION OF THE DRAWINGS

FIGS. 3(a)(1), 3(a)(2) and 3(b)(1) to 3(b)(3) are operation explanatory diagrams in the event of parts shortage at a parts feed unit in the same electronic parts mounting machine.

BEST MODE OF CARRYING OUT THE INVENTION

According to the parts mounting method of the invention, in the event of parts shortage, all of plural parts feed units are judged if the same parts are running short, if the same parts are not running out in any parts feed unit, the parts are supplied from such parts feed unit to mount parts, so that the production is not stopped if the production efficiency is lowered somewhat for exchanging the parts feed units, and the parts can be mounted continuously, so that the operation rate of the parts mounting machine may be enhanced.

Figure 1:
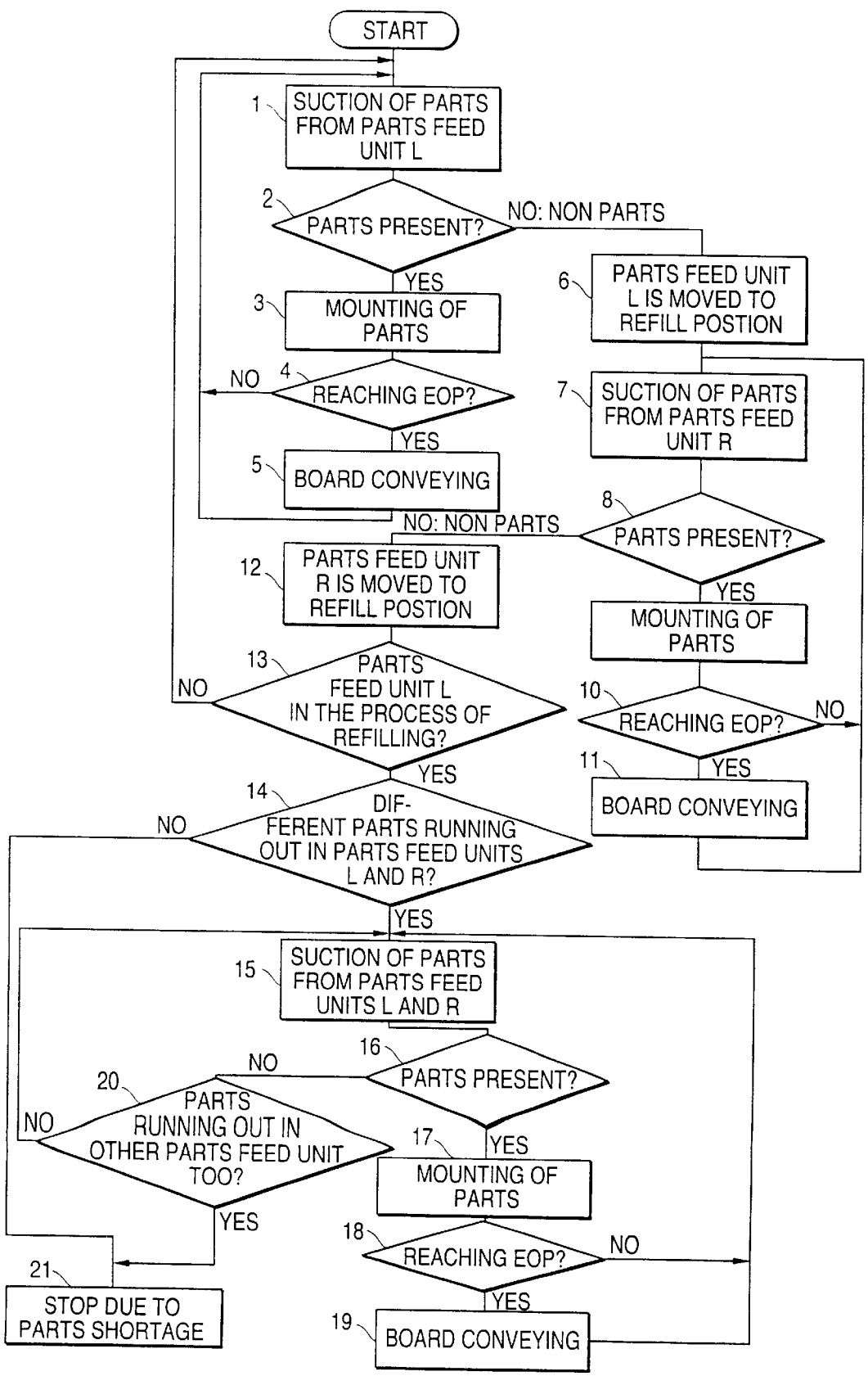
FIG. 1 is a flowchart of a parts mounting method in an embodiment of the invention.
Figure 2:
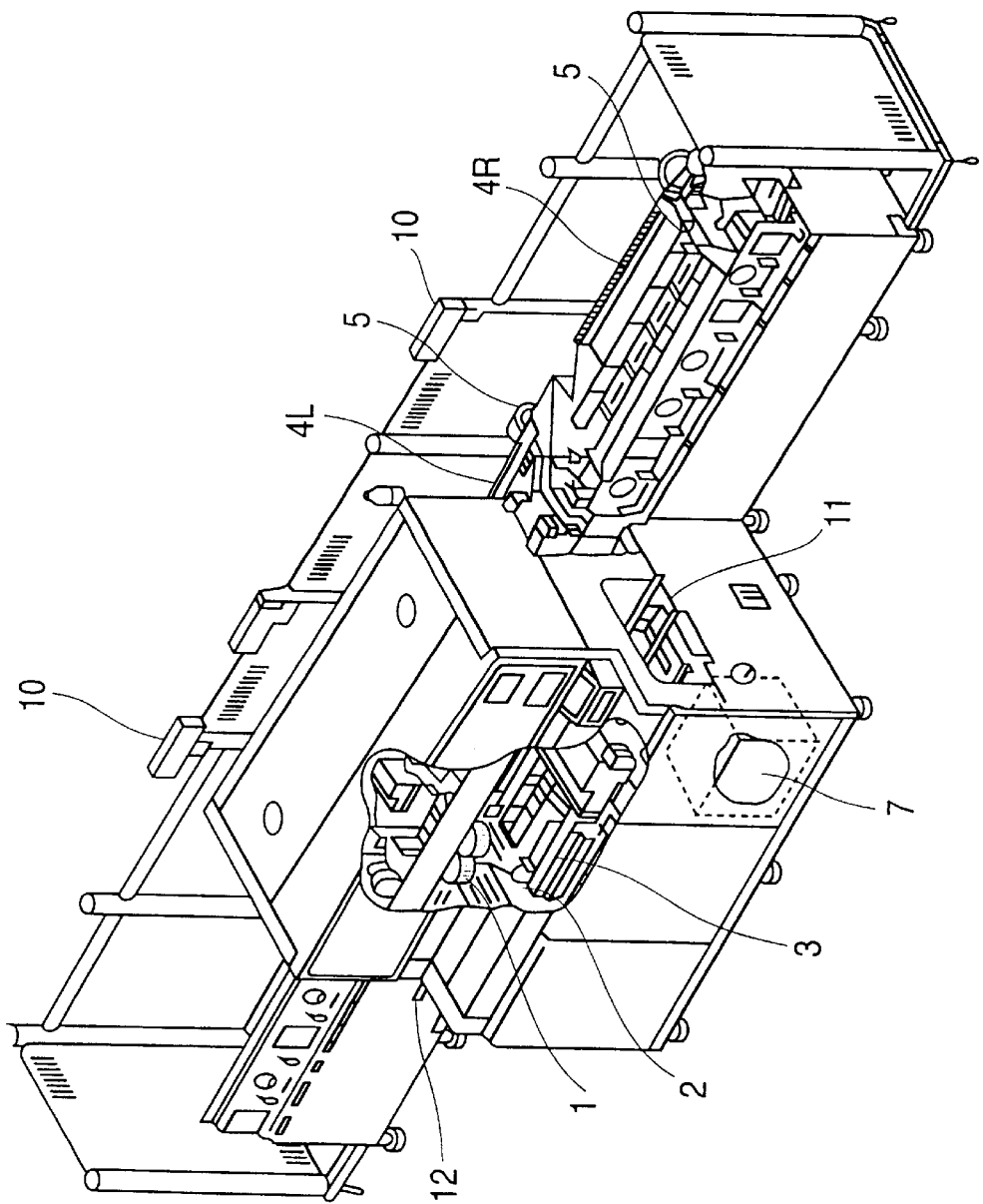
FIG. 2 is a perspective view showing a schematic constitution of an electronic parts mounting machine.
Figure 4:
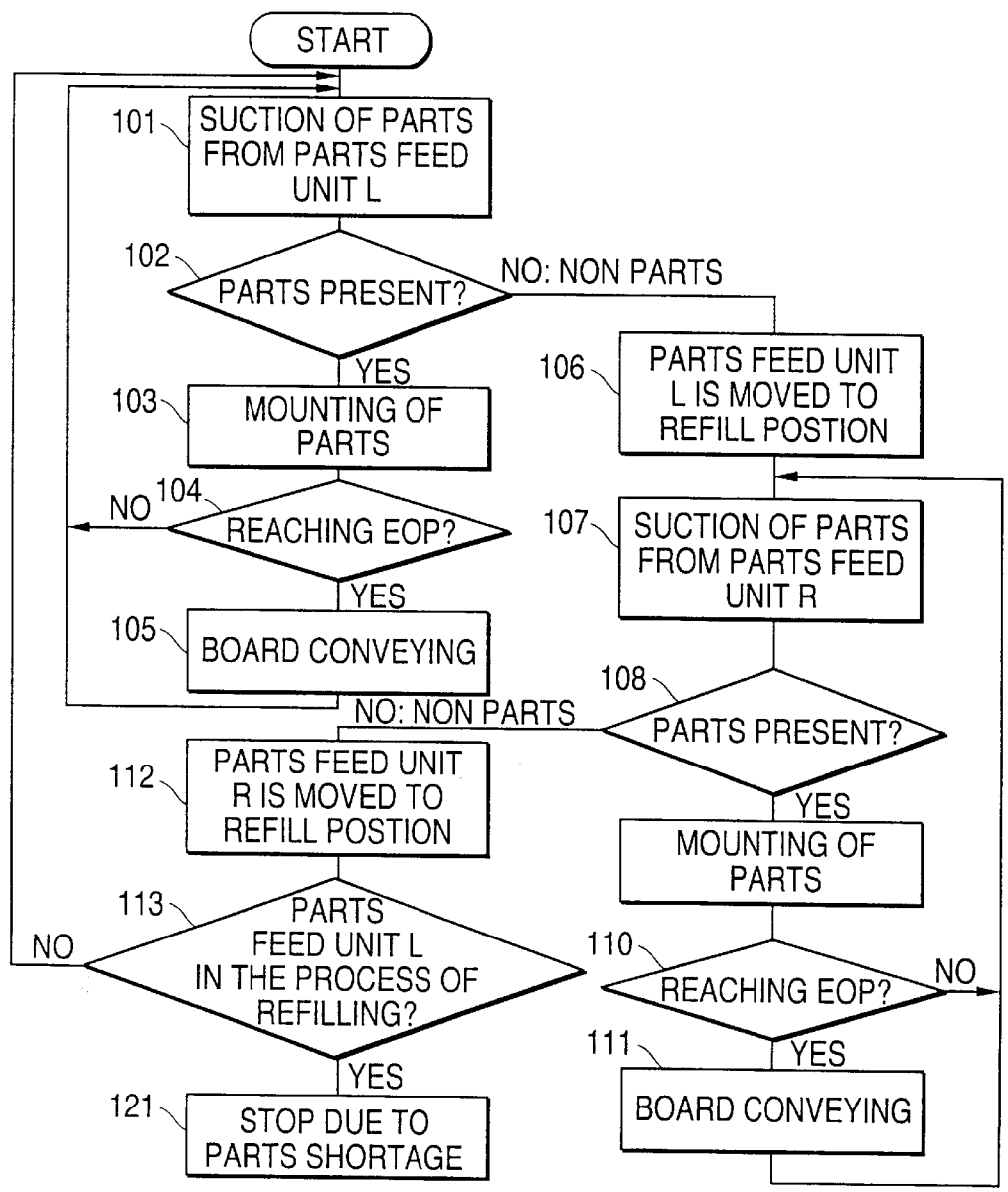
FIG. 4 is a flowchart of parts mounting method in a prior art.

An embodiment of parts mounting method of the invention is described while referring to FIG. 1. The constitution of the parts mounting machine is same as the one shown in FIG. 2 relating to the prior art, and its description is omitted.

The parts mounting method is explained by referring to the flowchart in FIG. 1. Parts are sucked to the nozzles 2 from the parts feed unit L (step #1), and it is judged if there are parts or not (step #2), and if there are parts, parts are mounted on a board fixed on the X-Y table 3 (step #3). It is then checked if all parts to be mounted on the board by this mounting machine are completely mounted (hereinafter called EOP) or not (step #4), and the operation of steps #1 to #3 is repeated until reaching the EOP. When reaching the EOP, the mounted board is discharged, and next board is sent in (step #5).

If running out of parts at step #2, the parts feed unit L is moved to the refill position (step #6), and production is continued by the parts feed unit R (steps #7 to #11). Herein, steps #7 to #11 are same in processing as steps #1 to #5. In the midst of steps #7 to #11, if parts shortage occurs at step #8, the parts feed unit R is moved to the refill position (step #12), and it is judged if the parts feed unit L running short of parts in the first place is still in the process of parts refill or not (step #13). If parts refill has been complete, going back to step #1, production is continued in the parts feed unit L (steps #1 to #5).

On the other hand, by the judgement at step #13, if parts refilling is not complete yet in the parts feed unit L first running out of parts, it is judged if the parts running out in the parts feed unit L and the parts running out in the parts feed unit R are same or not (step #14), and if same, the parts cannot be mounted, and the production is stopped due to parts shortage (step #21). By contrast, if judged to be different parts at step #14, parts are selectively sucked from both parts feed units L and R (step #15). For example, in FIG. 3, if parts A are used up in the parts feed unit L and parts B are used up in the parts feed unit R, as far as there are parts B and parts A respectively in the parts feed units L and R, parts necessary for production are present in the parts feed units, and it is not necessary to stop production, and therefore the parts B are sucked from the parts feed unit L and the part A, C to N from the parts feed unit R. Next, judging if the parts are present or running out (step #16), and if running out of parts, same as in step #14, it is judged if there are corresponding parts in the other parts feed unit (step #20), and if there are parts, going back to step #15, production is continued, and if parts are not available, shifting to step #21, production is stopped due to parts shortage. Or, if there are parts by the judgement at step #16, parts are mounted on the board fixed on the X-Y table 3 (step #17), and it is judged if all parts to be mounted on the board by this mounting machine are mounted (hereinafter called EOP) or not (step #18), and the operation of steps #15 to #17 is repeated until reaching the EOP. When reaching the EOP, the mounted board is discharged, and a next board is sent in (step #19).

Thus, according to the embodiment, even in the case where production is stopped due to parts shortage in the prior art, production can be continued without stopping.

INDUSTRIAL APPLICABILITY

Thus, according to the parts mounting method of the invention, in the event of parts shortage, all of plural parts feed units are judged if the same parts are running short, if the same parts are not running out in any parts feed unit, the parts are supplied from such parts feed unit to mount parts, so that the production is not stopped if the production efficiency is lowered somewhat for exchanging the parts feed units, and the parts can be mounted continuously, so that the operation rate of the parts mounting machine may be enhanced.

What is claimed is:

1. A method of mounting parts via a mounting machine having a plurality of parts feed units, said method comprising steps of:
    providing each one of said plurality of parts feed units with a first cassette including a plurality of first parts and a second cassette including a plurality of second parts,
    (a) when a shortage of said plurality of first parts occurs in said first cassette of one of said plurality of parts feed units, checking whether or not a shortage of first parts exists in any other parts feed units of said plurality of parts feed units other than said one of said plurality of parts feed units,
    (b) when a result of checking is that of a non-shortage of said first parts in at least one of said plurality of parts feed units, mounting at least one of said first parts from said at least one of said plurality of parts feed units, and
    (c) when a result of checking is that of a shortage of said first parts in said plurality of parts feed units, stopping mounting said first parts.

2. The method of claim 1, further comprising a step of:
    (d) when said shortage of said plurality of first parts occurs in said first cassette of one of said plurality of parts feed units, setting said one of said plurality of parts feed units to a refill position and refilling first parts into said first cassette of said one of said plurality of parts feed units.

3. The method of claim 1, further comprising a step of:
    (e) when said first parts are not present in each one of said plurality of parts feed units, stopping mounting said parts.

4. The method of claim 1, wherein step (b) further comprises a step of:
    refilling said first cassette of step (a) with new first parts while mounting the at least one of said first parts from said at least one of said plurality of parts feed units.

5. The method of claim 1, further including a step (bc) between steps (b) and (c), said step (bc) includes: when a shortage of said plurality of second parts occurs in said second cassette of another one of said plurality of parts feed units, checking whether or not a shortage of said second parts exists in any other parts feed units of said plurality of parts feed units, when a result of checking is that of a non-shortage of said second parts in at least one of said plurality of parts feed units, mounting at least one of said second parts from said at least one of said plurality of parts feed units.

6. A method of mounting parts comprising steps of:
    providing a plurality of feed units;
    providing each feed unit with a plurality of parts, said plurality of parts including first and second parts;
    a) mounting said plurality of parts from one of said plurality of feed units until said first parts are exhausted;
    b) refilling said one of said plurality of feed units with said first parts;
    c) mounting said plurality of parts from another of said plurality of feed units until said second parts are exhausted;
    d) repeating anew steps a)–c) if said first parts during step b) are available, wherein if said first parts are not available from step b) then,
        1) determining if said first parts are a same type of parts as said second parts.

7. The method of claim 6, further including a step of:
(e) mounting at least one of said second parts from said one of said plurality of feed units of step (a) if said first parts are not the same type of parts as said second parts.

8. A method of mounting parts comprising steps of:
providing a plurality of feed units, said plurality of feed units including first and second feed units;
providing each feed unit with a plurality of parts, said plurality of parts including first and second parts;
  (a) when a shortage of said first parts of said plurality of parts occurs in one of said first feed units of said plurality of feed units, checking whether a shortage of said second parts of said plurality of parts exists in all other parts feed units of said plurality of parts feed units other than the one of said first feed unit; and
  (b) when a result of checking is that of a non-shortage of said second parts in at least one of said all other parts feed units other than the one of said first feed unit, mounting at least one of said second parts.

9. A method of mounting parts comprising steps of:
providing a plurality of feed units, said plurality of feed units including first and second feed units;
providing each feed unit with a plurality of parts said plurality of parts including first and second parts;
  (a) when a shortage of said first parts of said plurality of parts occurs in one of said first feed units of said plurality of feed units, mounting a same type of part as said first parts from one of said second feed units of said plurality of feed units, and
  (b) when a shortage of said second parts of said plurality of parts occurs in one of said second feed units of said plurality of feed units, mounting a same type of part as said second parts from one of said first feed units of said plurality of feed units.

10. A method of mounting parts by a mounting machine, said mounting machine comprising a first parts feed unit (L) having a first cassette containing a first set of plurality of first parts (A) and a second cassette containing a first set of plurality of second parts (B), and a second parts feed unit (L) having other first cassette containing a second set of said plurality of first parts (A) and other second cassette containing a second set of said plurality of second parts (B),
said method comprising steps of:
  (a) when shortage occurs in said first parts (A) in the first cassette of said first parts feed unit, and further shortage occurs in said second parts (B) in said other second cassette of said second parts feed unit,
    checking if said first parts (A) in said other first cassette of said second parts feed unit are in shortage or not, and if said second parts (B) in said second cassette of said first parts feed unit are in shortage or not,
  (b) when the first parts (A) in said other first cassette of said second parts feed unit are not in shortage as a result of said checking,
    mounting said first parts (A) from said other first cassette of the second parts feed unit,
  (c) when the second parts (B) in said second cassette of said first parts feed unit are not in shortage as a result of said checking,
    mounting said second parts (B) from said second cassette of the first parts feed unit, and
  (d) when said first parts (A) in said other first cassette of said second parts feed unit are in shortage and further said second parts (B) in said second cassette of said first parts feed unit are in shortage as a result of said checking,
    stopping the mounting steps.

* * * * *